United States Patent [19]

Povey

[11] 4,054,836

[45] Oct. 18, 1977

[54] TRANSFORMER RATIO-ARM BRIDGE WITH IMPROVED BALANCING MEANS

[75] Inventor: Edmund H. Povey, Medford, Mass.

[73] Assignee: Doble Engineering Company, Watertown, Mass.

[21] Appl. No.: 678,072

[22] Filed: Apr. 19, 1976

[51] Int. Cl.² .............................................. G01R 7/00
[52] U.S. Cl. .............................. 324/140 D; 324/60 C; 324/DIG. 1
[58] Field of Search .................... 324/54, 60 R, 60 C, 324/DIG. 1

[56] References Cited

U.S. PATENT DOCUMENTS

| 2,570,218 | 10/1951 | Draganjac | 324/DIG. 1 |
| 3,842,344 | 10/1974 | Povey | 324/60 C |

Primary Examiner—M. Tokar

[57] ABSTRACT

A bridge circuit of the transformer ratio-arm type includes a feedback circuit that is responsive to the output winding of the transformer and that is connected to produce in the transformer a compensating magnetomotive force in such direction as to reduce the unbalance between the magnetomotive forces produced by the two ratio windings. The compensating magnetomotive force may be produced in various ways, as for example, an output current from the feedback circuit may be applied to either one of the ratio windings of the transformer or to a further auxiliary winding of the transformer to generate the compensating magnetomotive force.

21 Claims, 4 Drawing Figures

TRANSFORMER RATIO-ARM BRIDGE WITH IMPROVED BALANCING MEANS

SUMMARY OF THE INVENTION

This invention relates to apparatus for measuring electrical characteristics of materials and more particularly to a transformer ratio arm bridge that has a high degree of sensitivity and ease of operation, and is especially well adapted for measuring electrical characteristics such as capacitance, power factor and dissipation factor of electrical insulation at high voltages, for example, in the range from 10kV to 500kV, although not being limited to measurements in this range.

In electrical power systems it is well known that the electrical insulation deteriorates because of such factors as exposure to the elements, high operating temperatures, ionization and the effects of surge and lightning strokes. This deterioration is evidenced by a more or less continuous change in the capacitance of this insulation and an increase in the power factor. By making periodic electrical measurements, particularly of the power factor, the condition of the electrical insulation may thereby be monitored, permitting removal of an impaired component before complete failure occurs. With improvement in the quality of electrical insulation materials, there has been increasing need for highly sensitive measuring devices to detect the small changes that may indicate impending failure. Frequently it is desired to make the measurements while the electrical equipment is in operating position, and this requires that the measuring device be adapted to operate under field conditions.

A type of measuring circuit which has particular advantages for the field measurement of insulation characteristics is the transformer ratio arm bridge. In embodiments of this type of bridge the test voltage is applied to both a specimen branch in which the specimen to be tested is connected and to a standard branch. The resulting current in the specimen branch is passed through a first (specimen) winding of a ratio-arm transformer to produce a first magnetomotive force acting on the transformer core. The current in the standard branch is passed through a second (standard) winding of the transformer, but in such direction that the resulting magnetomotive force opposes that produced by the first winding. A third winding on the transformer supplies an output current to a detector as a function of the difference between the two magnetomotive forces.

At balance, the following relation exits:

$$C_x = C_s N_s / N_x$$

where $C_x$ and $C_s$ are the capacitances of the specimen and standard branches, and $N_s$ and $N_x$ the number of turns in the standard and specimen windings respectively. Balance may be acheived by various means, as by using a variable standard capacitor, by using the apparatus disclosed in U.S. Pat. No. 3,842,344 or by varying the number of active turns in the specimen or standard windings.

Where the loss characteristics of the standard branch and specimen branch do not match one another, the standard and specimen currents will not be in place and a complete balance cannot be obtained by such techniques. For example, a standard capacitor that has effectively no loss may be used in the standard branch and the test specimen may be lossy and have a defect angle ($\delta$). The phase angle difference between the standard current and the specimen current will produce a phase difference between the resulting magnetomotive forces so that zero magnetomotive force or zero flux cannot be obtained although the two forces are of the same magnitude. An external phase shifting network may be used in the standard branch, the network consisting, for example, of an adjustable resistor and a lossless capacitor, with the resistor connected in series with the first transformer winding and the capacitor in parallel with the series connection of the resistor and the winding. The bridge balance may then be completed by adjustment of the resistor, and the adjusting control may be calibrated to provide an indication of the phase defect angle ($\delta$) in terms of dissipation factor.

When the parameters of the test specimen are at considerable variance with the corresponding parameters of the standard branch, a difficulty in balancing occurs. To produce an exact balance of the bridge, the output winding and detector must respond to a slight imbalance in the two magnetomotive forces. The magnetic core of the transformer therefore is of a material that has a high permeability so that a relatively large amount of magnetic flux will be produced in response to a small magnetomotive force. As a consequence, when there is a moderate imbalance between the specimen and standard branches, as often happens if the approximate capacitance of the test specimen is not known, the core saturates. It is then difficult, if not impossible, to determine in which direction an adjustment should be made in order to approach a balance. In such circumstances, the procedure conventionally used has been to lower drastically the test voltage, which procedure is not always convenient.

It is an object of this invention to provide novel and improved apparatus for measuring electrical insulation characteristics.

Another object of the invention is to provide a novel and improved bridge circuit apparatus of the transformer ratio arm type.

In accordance with aspects of the invention, there is provided, in a bridge circuit of the type described above, a feedback circuit responsive to the third or output winding on the transformer and connected to produce in the transformer a compensating magnetomotive force in such direction as to reduce the unbalance between the magnetomotive forces produced by the first and second windings. This reduction of the mgnetomotive force facilitates balancing of the bridge circuit. The compensating magnetomotive force may be produced in various ways, as for example, an output current from the feedback circuit may be applied to either the first or second windings of the transformer or to a further auxiliary winding of the transformer to generate the compensating magnetomotive force.

Preferably the feedback circuit has a high gain (that is a gain above 10,000). The magnetomotive force supplied by the feedback circuit not only prevents the core of the transformer from saturating, but reduces and maintains the flux in the core at a low value similar to that which exists when the bridge is in balance. A current meter is connected to provide an indication of the current in the feedback circuit and the bridge is adjusted to reduce the current in the feedback circuit. Bridge balance is indicated by a null reading of the current meter in the feedback circuit, that null reading indicating a balance of the magnetomotive forces provided by the currents in the standard and specimen branches.

As previously explained, a null reading cannot be obtained when current in the standard and specimen branches are not in phase. An adjustable phase-shifting network may be used in the standard branch to accomplish a null reading, and the adjustment may be calibrated in terms of the dissipation factor of the specimen. When no phase shifting network is used, a null reading of the current in the feedback circuit cannot be obtained by bridge adjustments due to the resistive component of the specimen. Instead, the minimum feedback current obtainable represents the loss component of the specimen current. By making provision for removing the standard current from the circuit without other adjustment of the bridge circuit, a resulting feedback current can be obtained which provides an indication of the total current in the specimen branch. Similarly, provision for removal of the current supplied by the specimen branch from the circuit enables a resulting feedback current to be obtained that corresponds to the total current in the standard branch. Depending on the mechanism for adjusting the bridge and and manner in which the compensating magnetomotive force from the feedback circuit is generated, the dissipation factor and power factor of the specimen may be obtained from ratios of the minimum feedback current obtained when both specimen current and standard current are in the circuit, and from the feedback current when either the specimen or standard current is removed from the circuit.

Practical considerations may dictate the configuration of the bridge circuit. For example, it may be unduly expensive to include a separate feedback winding in the transformer. When the feedback current is applied to the second or specimen winding, the feedback circuit must have a current output equal to that of the specimen, and high capacitance specimens could require large feedback current outputs. If the feedback current is applied to the first or standard winding, it is easier to find the loss component of the specimen current when the bridge is balanced by using a variable standard capacitor or equivalent.

In a preferred circuit arrangement used for loss measurements, the feedback current is applied to the first or standard branch winding of the transformer and the final bridge balance is obtained by adjustment of the standard capacitor or equivalent. The turns ratio of the bridge may be adjusted to accommodate a range of capacitance values but final balancing is done through adjustment of the standard capacitor. With both the specimen and the standard currents in the circuit, the bridge is adjusted to obtain a minimum reading of feedback current which represents the loss component of the specimen. The specimen current is then removed from the circuit as by means of a switch and the resulting feedback current is measured. The ratio of the minimum current to that feedback current is the dissipation factor of the specimen. Alternatively, the standard current rather than the specimen current may be removed from the circuit. Then the ratio of the minimum current to the resulting feedback current is the power factor of the specimen.

The invention provides improved circuits for measuring electrical characteristics and is particularly adapted for measuring characteristics of electrical insulation and facilitates the making of sensitive and accurate measurements and the providing power factor and dissipation factor information.

Other objects, features and advantages of the invention will be seen as the following description of particular embodiments progresses, in conjunction with the drawing, in which.

DESCRIPTION OF PARTICULAR EMBODIMENTS

Figure 1:
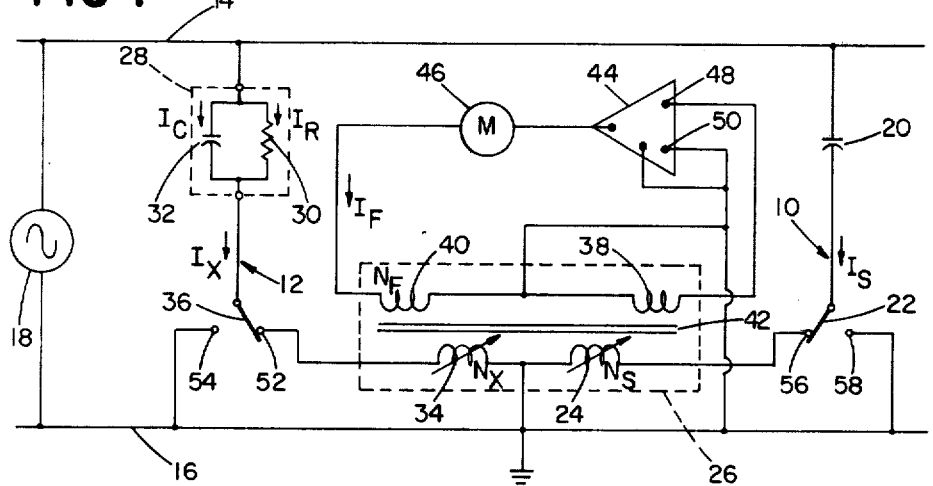
FIG. 1 is a schematic diagram of a bridge circuit in accordance with the invention.

With reference to FIG. 1, the circuit includes a standard branch 10 and a specimen branch 12, each being connected between high voltage conductor 14 and ground 16. A high voltage source is diagrammatically indicated at 18.

The standard branch 10 includes capacitor 20, switch 22 and ratio winding 24 of transformer 26. The test specimen 28 (which has a resistive component 30 and a capacitive component 32) is connected in specimen branch 12 and supplies current to ratio winding 34 of transformer 26 via switch 36. Winding 24 has $N_S$ turns and winding 34 has $N_X$ turns. The number of turns in either or both windings 24 and 34 may be variable. The transformer also has an output or detector winding 38 and a feedback winding 40 that has $N_F$ turns. The windings 24, 34, 38 and 40 are on common core 42.

In order to obtain maximum sensitivity and precision, the core 42 of transformer 26 should be of a material that has a high initial permeability and the coefficient of coupling between the ratio windings 24, 34 and the output winding 38 should be high. Further, in order to minimize any erroneous balance due to leakage flux from windings 24 or 34 linking 38, it is advisable to enclose detector winding 38 within a shield of high permeability magnetic material.

Amplifier 44 is connected to output winding 38. The output of amplifier 44 is applied through current meter 46 to feedback winding 40. A suitable amplifier is an Analog Device Type 118 amplifier which has a minimum gain of 250,000. The voltage induced in output winding 38 is applied to the input terminals 48, 50 of amplifier 44 to produce an amplified output current that flows through meter 46 and feedback winding 40, the current flow being in such a direction as to produce a magnetomotive force that reduces the unbalanced magnetomotive force produced by windings 24 and 34 and thus reduces the flux in the core 42 of transformer 26 to a low value. The meter 46 indicates the amount of current required to maintain the flux in core 42 at this virtually zero value.

Figure 2:
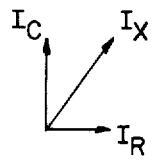
FIG. 2 is a vector diagram of test specimen currents.

FIG. 2 is a vector diagram of the currents in specimen 28, that is specimen current $I_X$ is the vector sum of a capacitive current component $I_C$ and a resistive current component $I_R$. In the circuit shown in FIG. 1, the magnetomotive force due to the current $I_X$ through specimen 28 is:

$$I_X N_X = I_R N_X + jI_C N_X \quad (1)$$

The magnetomotive force due to the current $I_S$ through standard capacitor 20 is:

$$I_S N_S = O + jI_S N_S \quad (2)$$

These two magnetomotive forces oppose each other, producing a difference MMF:

$$I_R N_X + j(I_C N_X - I_S N_S) \tag{3}$$

the magnitude of which is:
$$\sqrt{(I_R N_X)^2 + (I_C N_X - I_S N_S)^2} \tag{4}$$

The magnetomotive force supplied by the feedback network is $I_F N_F$. Equating $I_F N_F$ with Equation 4, squaring and solving for $I_F^2$ gives:

$$I_F^2 = I_R^2 N_X^2/N_F^2 + I_C^2 N_X^2/N_F^2 - 2I_C I_S N_X N_X/N_F^2 + I_S^2 N_S^2/N_F^2 \tag{5}$$

If bridge balance is obtained by varying $I_S$ or by adjusting $N_S$, differentiation of Equation 5 with respect to either $I_S$ or with respect to $N_S$ and equating either result to zero yields the following condition for minimim:

$$I_C N_X = I_S N_S \tag{6}$$

and substituting Equation 6 in Equation 5 gives:

$$I_F = I_R N_X/N_F \tag{7}$$

Thus the feedback current at bridge balance is a product of the resistive component of the current through the test specimen ($I_R$) multiplied by the product of the turns ratios of windings 34 and 40.

In operation, the bridge is balanced (by adjustment of either ($N_S$ or $I_S$) until the meter indication is a minimum. This adjustment is not hampered by satuation of core 42 since at all times the flux level in that core is extremely low.

With the bridge set at that balance, the indicated minimum represents the loss component ($I_R$) of the current through the test specimen 28 which cannot be balanced out by the current ($I_S$) in the standard capacitor 20 and must be supplied by amplifier 44. If the specimen current ($I_X$) is then removed from the transformer, by shifting switch 36 from terminal 52 to terminal 54 (disconnecting the test specimen from the transformer 26), the feedback current becomes $I_F'$—a direct function of the standard current ($I_S$):

$$I_F' = I_S N_S/N_F \tag{8}$$

Substituting Equation 8 in Equation 6 gives:

$$I_F' = I_C N_X/N_F \tag{9}$$

The ratio of Equations 7 and 9 gives:

$$\frac{I_F}{I_F'} = \frac{I_R}{I_C} = \text{dissipation factor of specimen 28} \tag{10}$$

Similarly, with the bridge setting remaining at balance, if the specimen current $I_X$ is reinserted into the circuit by returning switch 36 to terminal 52 and the standard current $I_S$ is removed from the circuit by throwing switch 22 from terminal 56 to terminal 58, the feedback current becomes $I_F''$—a direct function of the specimen current ($I_X$):

$$I_F'' = I_X N_X/N_F \tag{11}$$

The ratio of Equations 7 and 11 gives:

$$\frac{I_F}{I_F''} = \frac{I_R}{I_X} = \text{power factor of specimen 28} \tag{12}$$

The feedback current $I_F'$ multiplied by the turns ratios of windings 40 and 34 is the capacitive component ($I_C$) of the current through the test specimen; and the feedback current $I_F''$ multiplied by the turns ratio of windings 40 and 34 is the total current ($I_X$) through the test sepcimen 28. The ratio of the first feedback current ($I_F$) (which represents the loss component current ($I_R$) of the test specimen) to the second feedback current ($I_F'$) (which represents the capacitive component current ($I_C$) of the test specimen) is the dissipation factor of the test specimen; while the ratio of the first feedback current ($I_F$) to the third feedback current ($I_F''$) (which represents the total current ($I_X$) of the test specimen) is the power factor of the test specimen.

If bridge balance is obtained by adjusting $N_X$ (winding 34), the $I_F/I_F'$ ratio is the power factor and the $I_F/I_F''$ ratio is the dissipation factor of the test specimen 28, where, as above, $I_F$ is the minimum feedback current with both the specimen current and the standard current in circuit; $I_F'$ is the feedback current with the specimen current removed from the circuit; and $I_F''$ is the feedback current with the standard current removed from the circuit.

Figure 3:
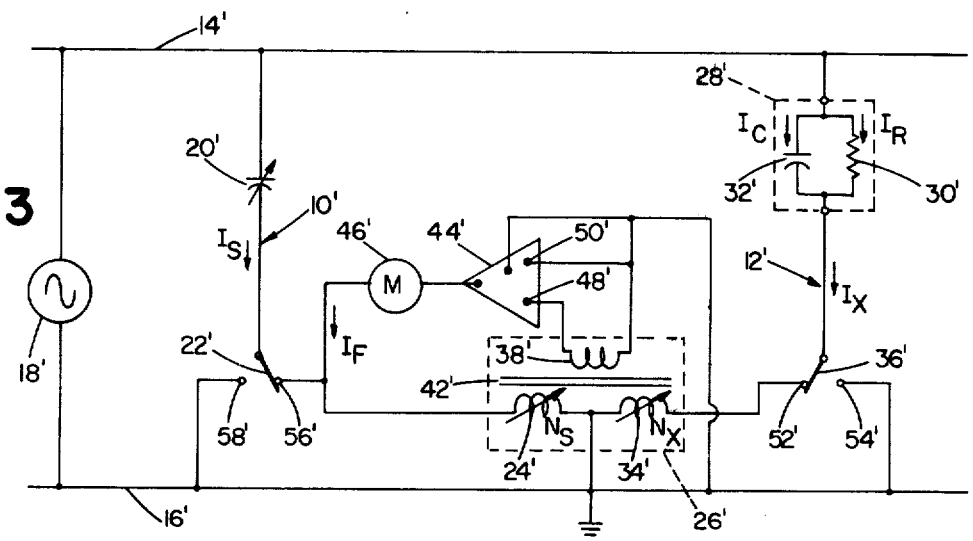
FIG. 3 is a schematic diagram of another embodiment of a bridge circuit in accordance with the invention.

A number of different configurations of the circuit are possible. For example, rather than using a separate feedback winding, feedback may be applied to either the specimen winding 34 or the standard winding 24. Also, bridge adjustments may be accomplished by adjustment of the turns of windings 24 and/or 34 or adjustment of the standard capacitor 20 or a simulated standard capacitor. Where it is desired to make loss measurements, it is preferred to apply feedback to the standard winding 24 and to adjust the standard capacitor to obtain final balance, with adjustments of the turns ratio of the standard winding 24 ($N_S$) and the specimen winding 34 ($N_X$) being used to cover various capacitance ranges. A circuit of that configuration is shown in FIG. 3 with the feedback current applied to standard winding 24'. In FIG. 3 components similar to corresponding components in FIG. 1 are identified by the same reference numerals with a prime appended thereto.

When a minimum value of current is indicated by meter 46':

$$I_F = I_R N_X/N_S$$

so that this minimum current ($I_F$) represents the loss component ($I_R$) of the current through the test specimen 28' which cannot be balanced out by the standard capacitor 20' and is supplied by the feedback network. Throwing switch 36' to terminal 54' removes the specimen current from the circuit so that the feedback current ($I_F'$) indicated by meter 46' multiplied by the turns ratio of windings 24' and 34' is the capacitive component ($I_C$) of the current through the test specimen 28'; and the ratio of the first current ($I_F$) to the second current ($I_F'$) is the dissipation factor of the test specimen 28'. Similarly, after reinserting the specimen current in the circuit and removing the standard current from the circuit by operation of switches 36' and 22', the resulting feedback current ($I_F''$) reading obtained from meter 46' multiplied by the turns ratio of windings 24' and 34' is the total current through the test specimen 28' and the ratio of the first current ($I_F$) to this third current ($I_F''$) is the power factor of the test specimen 28'.

Figure 4:
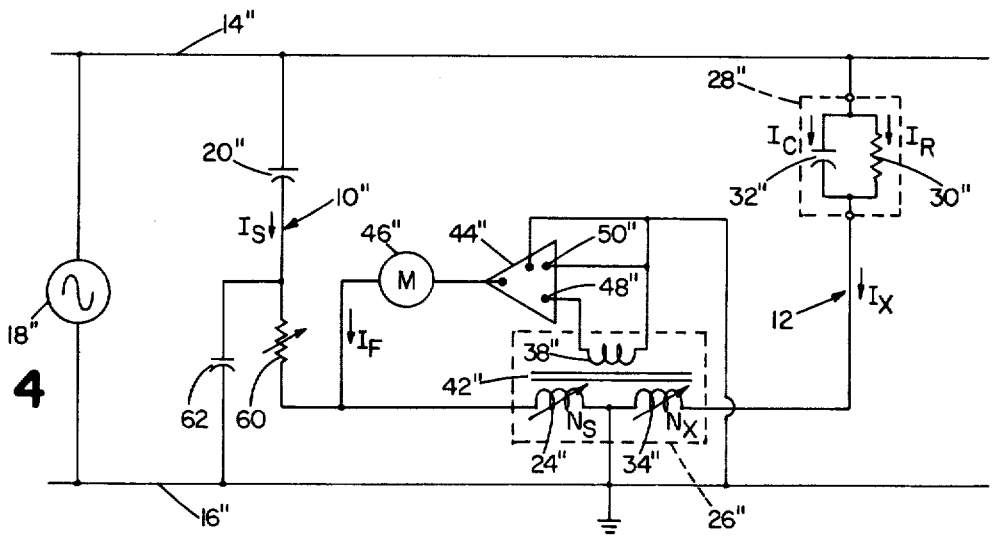
FIG. 4 is a schematic diagram of still another embodiment of a bridge circuit in accordance with the invention.

In still another circuit arrangement as indicated in FIG. 4, a phase shifting network that consists of an adjustable resistor 60 and a lossless capacitor 62 is connected in the standard branch 10''. In FIG. 4 components similar to corresponding components in FIG. 1 are identified by the same reference numerals with a double prime appended thereto. In this phase shifting network:

$$\tan\delta = R\omega(C+C_S)$$

where $R$ equals the resistance of winding 24'' and resistor 60, $C$ is the capacitance of capacitor 62, $C_S$ is the capacitance of standard capacitor 20'', and $\omega$ equals $2\pi F$, where $F$ is the frequency in hertz. The inductance of winding 24'' may be neglected as that inductance is negligible at balance.

The bridge and the phase shifting network is adjusted until the indication of meter 46'' is substantially zero which indicates that normal bridge balance has been obtained. The capacitance ($C_X$) of capacitor 32'' of the test specimen 28'' may then be computed from the relation $C_X = C_S N_S/N_X$ and the dissipation factor ($\tan\delta$) from the calibrated resistor 60 in the phase shifting network, the phase of the current $I_S$ as applied to the standard winding 24'' being shifted by the phase shifting network so that it is in phase opposition to the current $I_X$ of the test specimen 28''.

While particular embodiments of the invention have been shown and described, various modifications thereof will be apparent to those skilled in the art and therefore it is not intended that the invention be limited to the disclosed embodiments or to details thereof and departures may be made therefrom within the spirit and scope of the invention as defined in the claims.

What is claimed is:

1. In a bridge circuit of the transformer ratio arm type comprising a standard branch for producing a current corresponding to the current that would flow through a standard high voltage capacitor; a specimen branch in which a test specimen is connectable; and a transformer having a first winding connected to said standard branch, a second winding connected to said specimen branch, and a third winding coupled to said first and second windings to produce an output as a function of the difference between the two magnetomotive forces produced by said first and second windings; a feedback circuit connected between said third winding and said transformer to produce a compensating magnetomotive force in said transformer in such direction as to reduce unbalance due to the magnetomotive forces produced by said first and second windings.

2. The circuit as claimed in claim 1 and further including means for removing the application of current from said standard branch to said first winding.

3. The circuit as claimed in claim 1 and further including means for removing the application of current from said specimen branch to said second winding.

4. The circuit as claimed in claim 1 and further including a phase shifting network for shifting the phase of current flowing in said standard branch to cause the phase of the current through said standard branch to conform to the phase of the current through said specimen branch when a test specimen is connected therein.

5. The circuit as claimed in claim 1 wherein said feedback circuit is connected to a fourth winding on said transformer.

6. The circuit as claimed in claim 1 wherein said feedback circuit is connected to one of said first and second windings.

7. The circuit as claimed in claim 1 wherein said feedback circuit includes an amplifier and means for indicating the current flowing in said feedback circuit.

8. The circuit as claimed in claim 7 and further including means for removing the application of current from said standard branch to said winding and means for removing the application of current from said specimen branch to said second winding.

9. The circuit as claimed in claim 8 wherein said feedback circuit is connected to a fourth winding on said transformer.

10. The circuit as claimed in claim 8 wherein said feedback circuit is connected to one of said first and second windings.

11. The circuit as claimed in claim 7 and further including a phase shifting network for shifting the phase of current flowing in said standard branch to cause the phase of the current through said standard branch to conform to the phase of the current through said specimen branch when a test specimen is connected therein.

12. In a bridge circuit of the transformer ratio arm type for high voltage insulation testing comprising a standard branch for producing a current corresponding to the current that would flow through a standard high voltage capacitor; a specimen branch in which a test specimen is connectable; and a transformer having a core of high permeability material, a first winding connected to said standard branch, a second winding connected to said specimen branch, and a third winding coupled to said first and second windings to produce an output voltage as a function of the difference between the two magnetomotive forces produced by said first and second windings; a feedback circuit including a high gain amplifier connected to respond to the voltage induced in said third winding and to generate an output current for application to said transformer to produce a compensating magnetomotive force in said transformer in such direction as to reduce unbalance due to the magnetomotive forces produced by said first and second windings and thereby reduce the flux in the core of said transformer.

13. A bridge apparatus to be used in conjunction with a source of alternating test voltage for measuring the capacitance and loss characteristic of a test specimen, comprising a standard branch; a specimen branch in which said test specimen is connectable;

a transformer having a core, a first winding connected to be energized by the current through said standard branch, a second winding connected to be energized by the current through said specimen branch, the direction of the magnetomotive forces produced by said two currents acting in opposition to produce a resultant magnetic flux in the core of said transformer, and a third, or detector, winding, the voltage induced in said third winding being responsive to the magnetic flux produced by the joint action of said first and second windings;

means external to said first and second windings to cause the phase of the current through said first winding to conform to the phase of the current through said second winding;

adjustment means to equalize the magnetomotive forces produced by said first and second windings; and a negative feedback circuit including an amplifier, the input terminals of said amplifier being connected to said third winding, the output current of said amplifier being applied to said transformer to maintain the magnetic flux in the core of said transformer at a virtual zero value, and a current meter connected to indicate the output current of said amplifier, a null reading of said meter indicating that the bridge is in balance.

14. A bridge apparatus to be used in conjunction with a source of alternating voltage for measuring the capacitance and loss characteristics of a test specimen comprising a standard branch; a specimen branch in which said test specimen is connectable;

a transformer having a core, a first winding on said core connected to be energized by the current through said standard branch to produce magnetic flux in said core, a second winding on said core corrected to be energized by the current through said specimen branch to produce magnetic flux in said core, the ampere-turns of said second winding being in opposition to the ampere-turns of said first winding to produce a resultant flux in said transformer core, and a third winding, the voltage induced in said third winding being responsive to said resultant flux in said transformer core, adjustment means to change the ampere-turns produced by said first and second windings;

a negative feedback circuit including an amplifier connected to respond to the voltage induced in said third winding, and to generate an output current, means to apply said output current to said transformer to reduce said resultant flux in said transformer core;

and a current meter connected to measure the output current of said amplifier.

15. The circuit as claimed in claim 14 and further including a phase shifting network for shifting the phase of current flowing in said standard branch to cause the phase of the current through said standard branch to conform to the phase of the current through said specimen branch when a test specimen is connected therein.

16. The circuit as claimed in claim 15 wherein said standard branch includes a capacitor with negligible power loss.

17. The circuit as claimed in claim 16 and further including means for removing the application of current from said standard branch to said first winding.

18. The circuit as claimed in claim 17 and further including means for removing the application of current from said specimen branch to said second winding.

19. The circuit as claimed in claim 18 wherein said feedback circuit is connected to a fourth winding on said transformer.

20. The circuit as claimed in claim 18 wherein said feedback circuit is connected to one of said first and second windings.

21. The circuit as claimed in claim 18 wherein said standard branch includes a capacitor with negligible power loss.

* * * * *